United States Patent [19]

Steingroever et al.

[11] Patent Number: 4,782,293

[45] Date of Patent: Nov. 1, 1988

[54] PROCESS FOR ADJUSTING THE MAGNETIC FIELD STRENGTH OF PERMANENT MAGNETS

[76] Inventors: Dietrich Steingroever, 5060 Berg.-Gladbach 1; Erich Steingroever, Flensburger Str. 33, 5300 Bonn 1, both of Fed. Rep. of Germany

[21] Appl. No.: 899,401

[22] Filed: Aug. 22, 1986

[30] Foreign Application Priority Data

Mar. 21, 1986 [DE] Fed. Rep. of Germany ....... 3609530

[51] Int. Cl.[4] ..................... G01N 27/74; G01R 33/12; H01H 47/00; H01F 7/20

[52] U.S. Cl. .................................... 324/205; 361/147; 335/284

[58] Field of Search ................ 324/202, 205; 361/147, 361/148, 267; 335/284

[56] References Cited

U.S. PATENT DOCUMENTS 4,104,591 8/1978 Reiüting .............................. 361/147
4,156,191 5/1979 Knight et al. ....................... 324/205

FOREIGN PATENT DOCUMENTS 3312751 10/1984 Fed. Rep. of Germany .
2069259 8/1981 United Kingdom ................ 335/284

*Primary Examiner*—Reinhard J. Eisenzopf
*Assistant Examiner*—Walter E. Snow
*Attorney, Agent, or Firm*—Harold Gell

[57] ABSTRACT

A description is given of a pulse device for zeroing a permanent magnet to any desired operating point on its demagnetization curve, in which the strength of the demagnetizing pulse is automatically determined from the ratio between the operating point reached and the desired operating point.

9 Claims, 1 Drawing Sheet

PROCESS FOR ADJUSTING THE MAGNETIC FIELD STRENGTH OF PERMANENT MAGNETS

The invention pertains to a process and a device for automatic calibration of permanent magnets or permanent magnet systems with permanent magnets and soft-iron terminals, i.e., to set their operating point to a preselected value on the demagnetization curve in the second quadrant of the hysteresis curve.

Performing this setting of the operating point, also called zeroing, by applying an initially increasing alternating magnetic field until the magnet to be zeroed lies at the desired operating point, is a known process. In this process, the magnet is continually tested by measuring its field strength or its magnetic flux. When the desired value is attained, the alternating field is again allowed to decay.

This known process cannot be performed or can only be performed with great difficulty with magnets with high coercivity field strength, e.g., with those made of rare earth-cobalt compounds, barium ferrites and other similar materials. The high demagnetizing field strengths needed for zeroing can only be attained with a high current density and an associated heating of the field coils since the current must flow during the entire process.

Another known process operates with demagnetizing field pulses whose strength is continually increased until the desired operating point is reached (DPA 33.12.751.4). Since the pulses only last a short time, heating of the field coils is considerably less. The disadvantage of this process is that if the strength of the pulses is increased in large steps, only coarse zeroing is obtained; or that if it is increased in small steps, although finer zeroing is obtained, many steps are needed to do so, which in turn requires more time.

These disadvantages of known processes are eliminated with this invention. It allows permanent magnets to be zeroed in the shortest possible period of time.

The invention is characterized by the fact that the demagnetizing field strength of the pulses is determined anew in each case from the ratio between the operating point already reached and the desired operating point.

According to the invention, if the preceding pulse was too high, so that the desired operating point was exceeded, the strength of the pulse is decreased, after which a magnetizing pulse is first applied to remagnetize to saturation.

Magnetic saturation is reached at field strength $H_s$, the operating line is labelled A, with the desired operating point at $B_{ref}$ and the successive pulses demagnetize on the outer hysteresis curve to 0, 1, 2 and 3. The corresponding pulse strengths are $J^0$, $\frac{1}{2}\times J_0$, $\frac{3}{4}\times J_0$ and $\frac{5}{8}\times J_0$.

According to the invention, the pulse strengths are scaled according to the series $(1\pm\frac{1}{2}^n)$, so that the first demagnetizing pulse (n=0) has at least the strength $J_0$ of the pulse needed for complete demagnetization, the following has the strength $J_1=(1-\frac{1}{2})\times J_0$, then, if the operating point has not yet been reached, $J_2=(1+\frac{1}{4})\times J_1$ or, if it has been exceeded, $J_2'=(1-\frac{1}{4})\times J_1$.

In the last case, remagnetization back to saturation is first conducted prior to the demagnetizer pulse $J_2'$. The next pulse $J_2$ then has a strength $(1+\frac{1}{8})\times J_2$ or $(1-\frac{1}{8})\times J^2$, depending on the operating point reached at that time. The n-th pulse would have a strength $J_n=(1\pm\frac{1}{2}^n)\times J_{n-1}$.

In a known manner, each pulse can be followed by an oscillating discharge which stabilizes the operating point obtained. This is indicated by C.

To perform the process according to the invention, a programmable control system can be used, which charges the capacitor of the pulse magnetizer to corresponding voltage stages $U_n$, so that demagnetization pulses $J_n$ of corresponding strength also result.

By means of the process and device according to the invention, a permanent magnet can be zeroed with demagnetizing pulses to any desired operating point on its demagnetization curve quickly and with high precision.

For zeroing to ±1%, for example, a maximum of seven pulses are required, since $\frac{1}{2}^7-0.01$.

Figure 1:
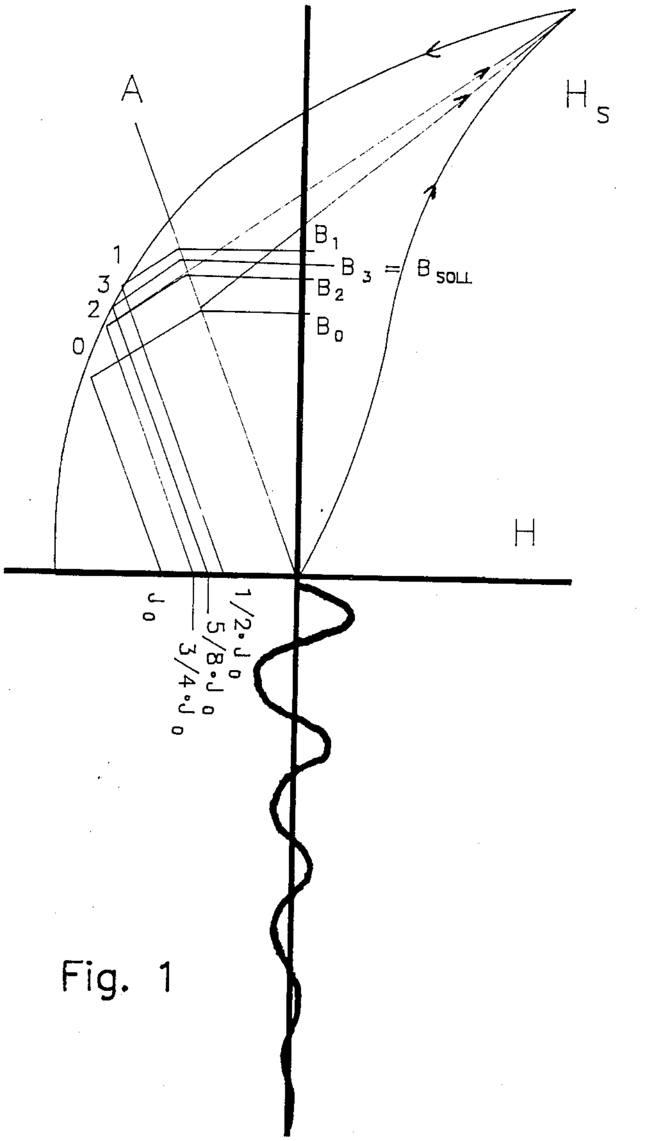
FIG. 1 illustrates the coarse of a hysteresis curve B(H).
Figure 2:
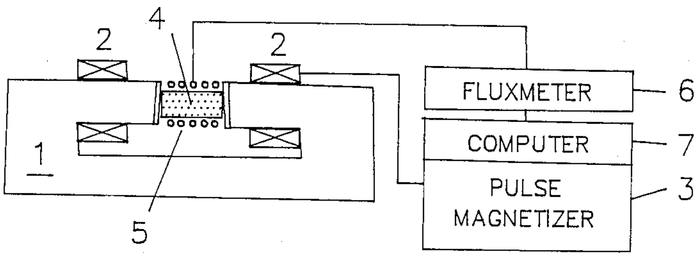
FIG. 2 illustrates a device for performing the process according to the invention.

A devicé for performing the process according to the invention is illustrated in FIG. 2, on which the numbers represent:

1. a U-shaped magnetization yoke, advantageously made of lamellar iron,
2. the field coils placed on its arms at the air gap, which are connected to
3. the pulse magnetizer, consisting of a bank of capacitors which are discharged to the field coils through a high-current switch,
4. the permanent magnet to be calibrated,
5. a coil surrounding it, measuring its flux,
6. a fluxmeter for said flux,
7. a computer which calculates each succeeding pulse from the measured flux values in relationship to the desired value and controls the pulse magnetizier.

The magnetization values obtained can also be measured with other known processes and sensors, e.g., with Hall probes, with rotation seed sensors, with photosensors producing an indicator deflection, etc.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What I claim is:

1. A process for automatically setting the operating point of permanent magnets to a specific value by means of successive demagnetizing pulses, characterized by the fact that the strength of the pulse is determined anew in each case from the ratio between the operating point reached and the desired operating point in a geometric progression.

2. A process according to claim 1, characterized by the fact that the pulse strengths are scaled according to the series $(1\pm\frac{1}{2}^n)$.

3. A process according to claim 2, characterized by the fact that the first demagnetizing pulse $J_0$ reaches at least above the desired operating point, that the following pulse $J_1$ has a strength of $(1-\frac{1}{2})\times J_0=\frac{1}{2}\times J_0$, and that the following pulses $J_n$ have a stength of $(1\pm\frac{1}{2}^n)\times J_{n-1}$.

4. A process according to člaim 3, characterized by the fact that the strength of the pulses is increased if the operating point has not yet been reached.

5. A process according to claim 3, characterized by the fact that the strength of the pulses is decreased, and a magnetization pulse is produced before the pulse up to saturation of the magnet, if the preceding pulse was too high, so that the operating point was exceeded.

6. A process according to claim 1, characterized by the fact that the first demagnetizing pulse $J_0$ reaches at least above the desired operating point, that the following pulse $J_1$ has a strength of $(1-\frac{1}{2})\times J_0=\frac{1}{2}\times J_0$, and that the following pulses $J_n$ have a strength of $(1\pm\frac{1}{2}^n)\times J_{n-1}$.

7. A process according to claim 2, characterized by the fact that the strength of the pulses is increased if the operating point has not yet been reached.

8. A process according to claim 2, characterized by the fact that the strength of the pulses is decreased, and a magnetization pulse is produced before the pulse up to saturation of the magnet, if the preceding pulse was too high, so that the operating point was exceeded.

9. A process according to any of claims 1 through 5, characterized by the fact that each demagnetizing pulse following the initial demagnetizing pulse follows an oscillating discharge which stabilizes the operating point obtained by the prior demagnetizing pulse.

* * * * *